United States Patent
Hu et al.

(10) Patent No.: US 9,691,745 B2
(45) Date of Patent: Jun. 27, 2017

(54) BONDING STRUCTURE FOR FORMING A PACKAGE ON PACKAGE (POP) STRUCTURE AND METHOD FOR FORMING THE SAME

(71) Applicant: Taiwan Semiconductor Manufacturing Co., Ltd., Hsin-Chu (TW)

(72) Inventors: James Hu, Hsinchu (TW); Ming-Da Cheng, Jhubei (TW); Chung-Shi Liu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 376 days.

(21) Appl. No.: 13/927,568

(22) Filed: Jun. 26, 2013

(65) Prior Publication Data

US 2015/0001725 A1 Jan. 1, 2015

(51) Int. Cl.
*H01L 29/24* (2006.01)
*H01L 21/76* (2006.01)
*H01L 25/04* (2014.01)
*H01L 25/00* (2006.01)
*H01L 25/10* (2006.01)

(52) U.S. Cl.
CPC ............ *H01L 25/50* (2013.01); *H01L 25/105* (2013.01); *H01L 2224/11* (2013.01); *H01L 2225/1058* (2013.01); *H01L 2225/1082* (2013.01); *H01L 2924/0002* (2013.01); *H01L 2924/12042* (2013.01); *H01L 2924/1305* (2013.01); *H01L 2924/13091* (2013.01); *H01L 2924/181* (2013.01)

(58) Field of Classification Search
CPC ..... H01L 23/53238; H01L 2924/01079; H01L 2924/01013; H01L 2924/01029; H01L 2924/01078; H01L 21/76843; H01L 21/76877; H01L 21/76873; H01L 21/76849
USPC .......................................... 257/762; 438/687
See application file for complete search history.

(56) References Cited

U.S. PATENT DOCUMENTS 6,222,272 B1 * 4/2001 Takayama et al. ........... 257/773
2004/0207052 A1 * 10/2004 Joshi ................. H01L 23/49562
257/666

(Continued)

FOREIGN PATENT DOCUMENTS

JP 2009-99669 A 5/2009
JP 2009-105441 A 5/2009

(Continued)

*Primary Examiner* — John C Ingham
*Assistant Examiner* — Didarul Mazumder
(74) *Attorney, Agent, or Firm* — Birch, Stewart, Kolasch & Birch, LLP (57) ABSTRACT

Embodiments of mechanisms of a semiconductor device package and package on package (PoP) structure are provided. The semiconductor device package includes a substrate and a metal pad formed on the substrate. The semiconductor device package further includes a conductive element formed on the metal pad, and the metal pad electrically contacts the conductive element, and at least a portion of the conductive element is embedded in a molding compound, and the conductive element has a recess configured to provide an additional bonding interfacial area.

17 Claims, 10 Drawing Sheets (56) References Cited

U.S. PATENT DOCUMENTS

| | | | |
|---|---|---|---|
| 2010/0072600 A1 | 3/2010 | Gerber | |
| 2010/0283140 A1* | 11/2010 | Kim et al. | 257/686 |
| 2011/0068481 A1 | 3/2011 | Park et al. | |
| 2011/0193219 A1* | 8/2011 | Lai et al. | 257/737 |
| 2011/0233771 A1 | 9/2011 | Kwon et al. | |
| 2011/0254146 A1* | 10/2011 | Cho | H01L 24/05 257/692 |
| 2011/0254160 A1 | 10/2011 | Tsai et al. | |
| 2011/0291275 A1* | 12/2011 | Lin | H01L 24/11 257/738 |
| 2012/0091597 A1 | 4/2012 | Kwon et al. | |
| 2012/0153499 A1 | 6/2012 | Byun et al. | |
| 2013/0099385 A1 | 4/2013 | Chen et al. | |
| 2013/0119549 A1 | 5/2013 | Cheng et al. | |
| 2013/0234317 A1* | 9/2013 | Chen et al. | 257/737 |
| 2013/0307140 A1 | 11/2013 | Huang et al. | |
| 2013/0313726 A1* | 11/2013 | Uehling | 257/777 |
| 2014/0264940 A1 | 9/2014 | Byun et al. | |
| 2014/0367867 A1 | 12/2014 | Lin et al. | |
| 2014/0374902 A1 | 12/2014 | Lee et al. | |
| 2015/0001708 A1 | 1/2015 | Lin | |

FOREIGN PATENT DOCUMENTS

| | | |
|---|---|---|
| KR | 10-2008-0061969 A | 7/2008 |
| KR | 10-2012-0070093 | 6/2012 |
| KR | 10-2013-0045138 | 5/2013 |

\* cited by examiner

BONDING STRUCTURE FOR FORMING A PACKAGE ON PACKAGE (POP) STRUCTURE AND METHOD FOR FORMING THE SAME

CROSS REFERENCE TO RELATED APPLICATION

This application is related to the following co-pending and commonly assigned patent application: U.S. application Ser. No. 13/961,589, filed on Aug. 7, 2013.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry has continued to improve upon the integration density of electronic components (e.g., transistors, diodes, resistors, capacitors, etc.) by continual reductions in minimum feature sizes, which allow for more components to be integrated into a given area. These smaller electronic components also require smaller packages that utilize less area and/or have lower heights than packages of the past, for some applications.

Three dimensional integrated circuits (3DICs) are a recent development in semiconductor packaging in which multiple semiconductor dies are stacked upon one another, such as package-on-package (PoP) and system-in-package (SiP) packaging techniques. By adopting the new packaging technologies, the integration levels of the packages may be increased. These relatively new types of packaging technologies for semiconductors face manufacturing challenges.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact. In addition, the like elements in various figures and embodiments are identified by the same or similar reference numerals.

Figure 1:
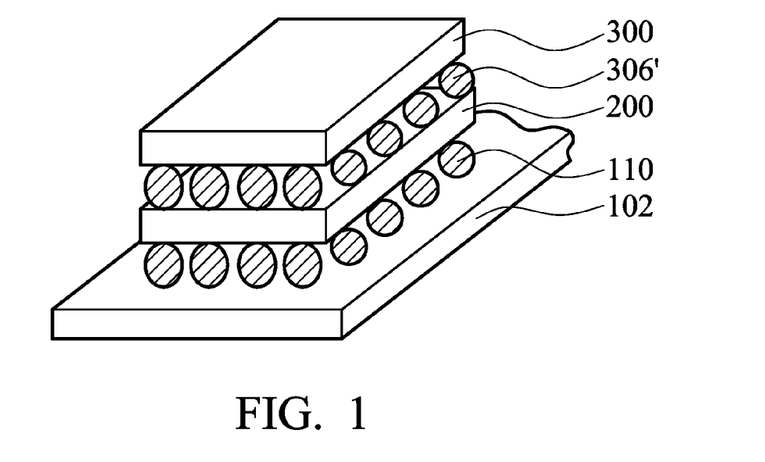
FIG. 1 shows a perspective view of a package on package (PoP) structure, in accordance with some embodiments of the disclosure.

Embodiments of the disclosure provide package on package (PoP) structures and methods for forming the same. FIG. 1 shows a perspective view of a PoP structure 100 having semiconductor device package 200 and another semiconductor device package 300, which is further bonded to a substrate 102. In some embodiments, the semiconductor device package 200 is bonded to the semiconductor device package 300 via conductive connectors 306', and the semiconductor device package 200 is bonded to the substrate 102 via the conductive connectors 110. Each semiconductor device package, such as the semiconductor device package 200 or the semiconductor device package 300, includes at least a semiconductor die (not shown). The semiconductor die includes a substrate employed in a semiconductor substrate integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the substrate include transistors (e.g., metal oxide semiconductor field effect transistors (MOS- FET), complementary metal oxide semiconductor (CMOS) transistors, bipolar junction transistors (BJT), high voltage transistors, high frequency transistors, p-channel and/or n channel field effect transistors (PFETs/NFETs), etc.); resistors; diodes; capacitors; inductors; fuses; and other suitable elements. Various processes are performed to form various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

The substrate 102 may be made of a semiconductor wafer, or a portion of wafer. In some embodiments, the substrate 102 includes silicon, gallium arsenide, silicon on insulator ("SOI") or other similar materials. In some embodiments, the substrate 102 includes interconnect structures. In some embodiments, the substrate 102 also includes passive devices such as resistors, capacitors, inductors and the like, or active devices such as transistors. In addition, the substrate 102 may be made of other materials. For example, in some embodiments, the substrate 102 is a multiple-layer circuit board. In some embodiments, the substrate 102 also includes bismaleimide triazine (BT) resin, FR-4 (a composite material composed of woven fiberglass cloth with an epoxy resin binder that is flame resistant), FR-5, ceramic, glass, plastic, tape, film, or other supporting materials that may carry the conductive pads or lands needed to receive conductive terminals.

Figure 2A:
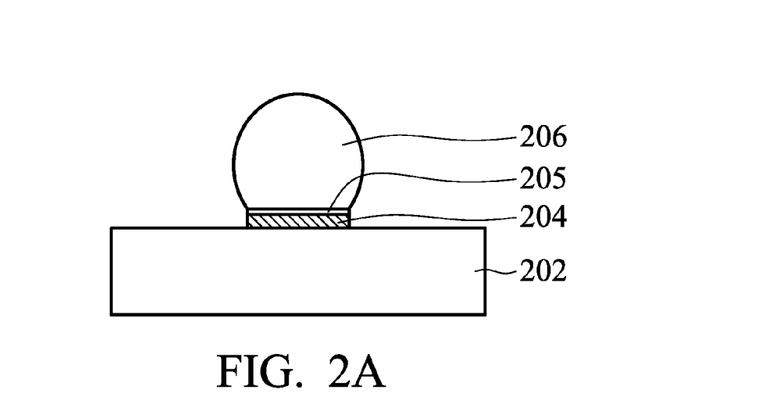
FIGS. 2A-2E show cross-sectional representations of various stages of forming a package on package (PoP) structure, in accordance with some embodiments of the disclosure.

FIGS. 2A-2E show cross-sectional representations of various stages of forming a PoP structure 150A. Referring to FIG. 2A, a metal pad 204 is formed on a substrate 202. An under bump metallization (UBM) layer 205 is formed on the metal pad 204. A conductive element 206 is formed on the UBM layer 205. The substrate 202, the metal pad 204, the UBM layer 205 and the conductive element 206 form a part of the semiconductor device package 200 as shown in FIG. 1.

The substrate 202 may be made of a semiconductor wafer, or a portion of wafer. The substrate 202 includes the semiconductor die as described above. In addition, the substrate 202 may further includes through substrate vias (TSVs) and may be an interposer. The metal pad 204 is made of conductive materials with low resistivity, such as copper (Cu), aluminum (Al), Cu alloys, Al alloys or other suitable materials. The metal pad 204 is formed by using metal deposition, photolithography and etching processes. The metal pad 204 is electrically connected to semiconductor devices in the substrate 202. In some embodiments, the thickness of the metal pad 204 is in a range from about 10 to about 1000 µm.

The UBM layer 205 may contain an adhesion layer and/or a wetting layer. In some embodiments, the UBM layer 205 is made of titanium (Ti), titanium nitride (TiN), tantalum nitride (TaN), tantalum (Ta), or the like. In some embodiments, the UBM layer 205 further includes a copper seed layer.

The conductive element 206 is made of conductive materials, such as copper (Cu), gold, silver, or other suitable materials. In some embodiments, a metal ball is placed on the metal pad 204 by a stencil process. In some embodiments, the conductive element 206 is made of a copper (Cu) ball. When the conductive element 206 is made of the copper ball, a solder paste is used as an adhesive layer between the UBM layer 205 and the copper ball.

Figure 2B:
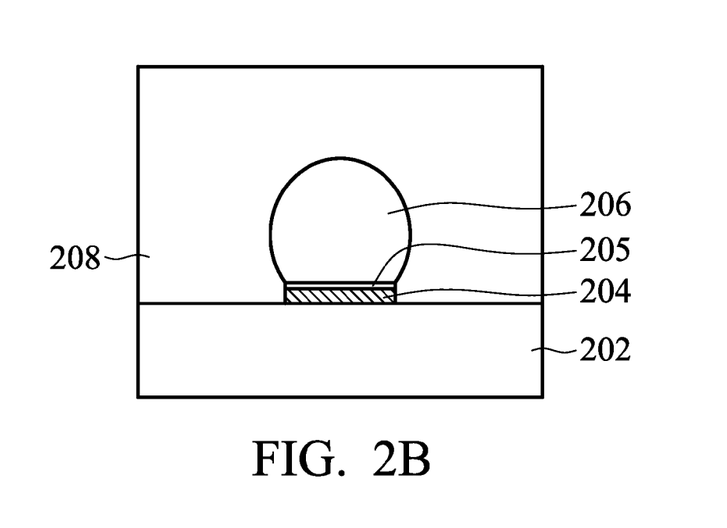

Referring to FIG. 2B, a molding compound 208 is formed on the substrate 202 and the conductive element 206 to cover the conductive element 206. The metal pad 204 is electrically connected to semiconductor devices (not shown) in the substrate 202. The molding compound 208 is made of an insulating material to provide support and insulation for a bonding structure. In some embodiments, the conductive element 206 is formed on the metal pad 204 before forming the molding compound 208, and then the molding compound 208 is formed on the substrate 202 and the conductive element 206.

The molding compound 208 is initially in a liquid form and is dried after being dispensed on the conductive element 206 to cover the entire conductive element 206, in accordance with some embodiments. For example, the molding compound 208 may initially include an epoxy, a filler, or solvent etc. In some embodiments, the molding compound 208 may be formed by transfer molding, where a measured molding material (usually a thermoset plastic) is pre-heated to a liquid form before being applied on the substrate. The molding material is heated after being applied to finalize the molding process. Various resins may be used as the materials of the molding compound.

Figure 2C:
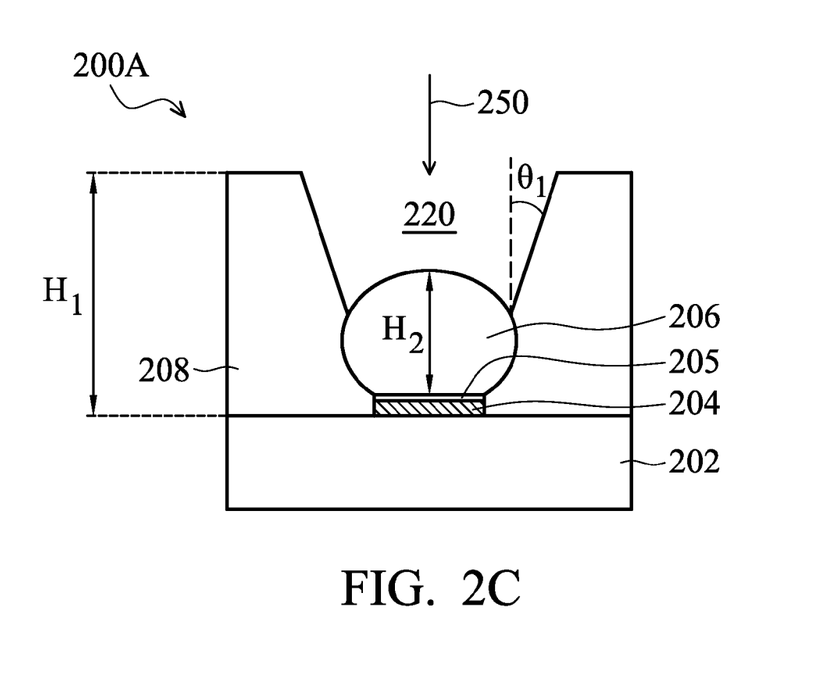

Referring to FIG. 2C, a portion of the molding compound 208 is removed to form an opening 220 exposing the conductive element 206. As a result, the semiconductor device package 200A is obtained. In some embodiments, the molding compound 208 is removed by a laser drilling process 250. In some embodiments, the molding compound 208 has a height $H_1$ in a range from about 50 µm to about 1000 µm. In some embodiments, the conductive element 206 has a height $H_2$ in a range from about 10 µm to about 500 µm. In some embodiments, an angle $\theta_1$ between a sidewall of the opening 220 and a normal line $N_1$ to a main surface of the substrate 202 is greater than zero. In some embodiments, the angle $\theta_1$ is in a range from about 5 degrees to about 60 degrees.

Figure 2D:
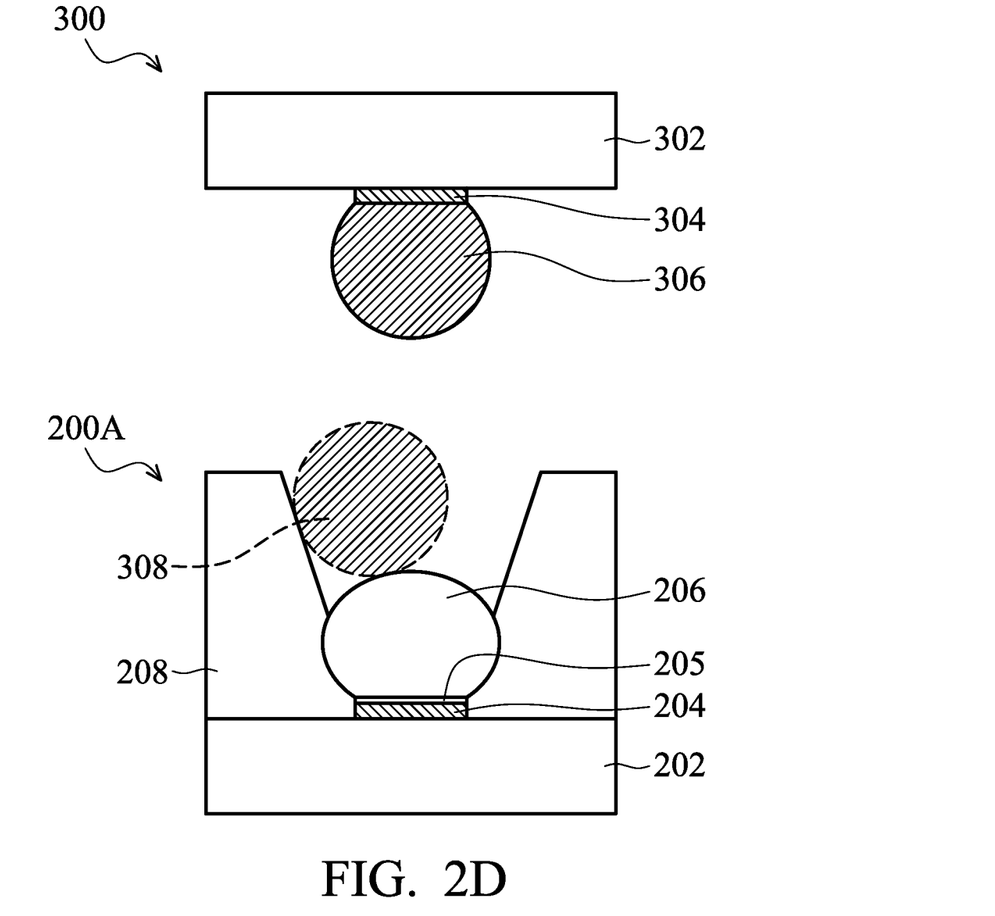

Referring to FIG. 2D, another semiconductor device package 300 is provided. The semiconductor device package 300 includes a metal pad 304 formed on a substrate 302, and a conductive connector 306 formed on the metal pad 304. In some embodiments, an (UBM) layer (not shown) is formed on the metal pad 306. In some embodiments, another conductive connector 308 is formed on the conductive element 206. In some other embodiments, the conductive connector 308 is not must needed.

The conductive connectors 306 and 308 are made of conductive materials with low resistivity, such as solder or solder alloy. Exemplary elements included in the solder alloy may include Sn, Pb, Ag, Cu, Ni, Bi or combinations thereof Afterwards, referring to FIG. 2E, in some embodiments, the conductive element 206 and the conductive connectors 306 and 308 are fused by a reflow process. The semiconductor device package 200A and the semiconductor device package 300 are bonded to each other via a bonding structure 410A, and the PoP structure 150A is obtained. The bonding structure 410A includes the metal pad 204, the conductive element 206, the metal pad 304 and a conductive connector 306' fused from the conductive connectors 306 and 308. The bonding structure 410A has a bonding interfacial area $S_1$ (the area from $A_1$ to $A_1'$ shown in FIG. 2E) between the conductive connector 306' and the conductive element 206. In some other embodiments, the conductive connector 306 is directly bonded to the conductive element 206 to form the conductive connector 306' when the conductive connector 308 is not presented.

Figure 2E:
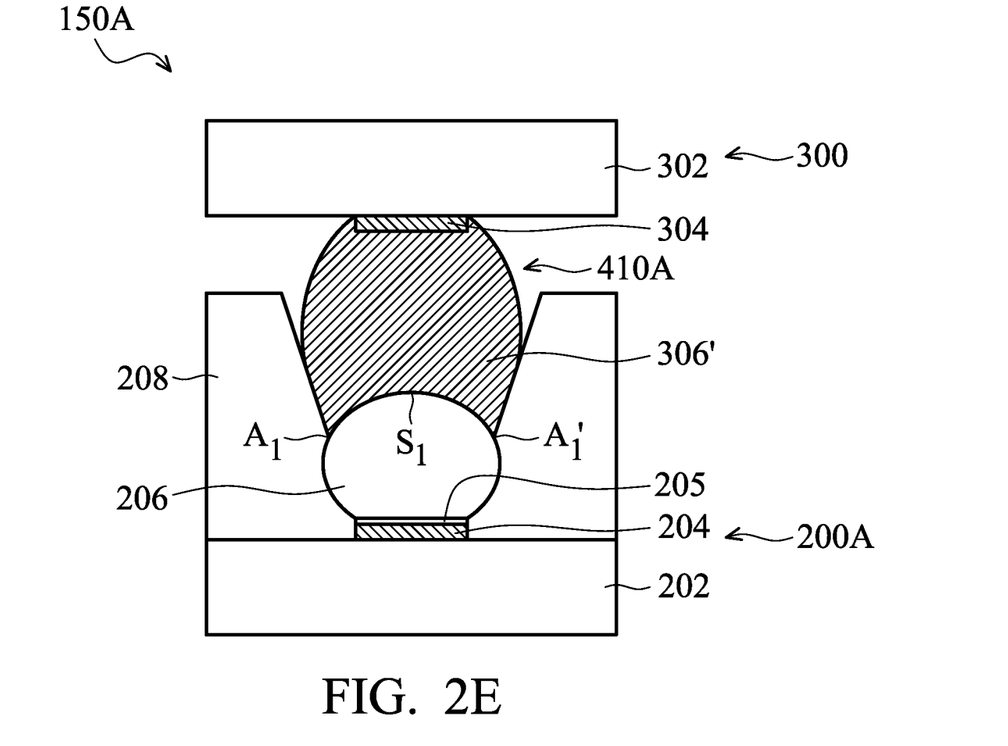

Since a portion of the conductive element 206 is embedded in the molding compound 208, the alignment of the conductive connector 306 are more accurate, and the shorting between neighboring bonding structures 410A is prevented.

For advanced packaging requirements, it is desirable to improve the bonding strength between the semiconductor device package 200A and another semiconductor device package 300. The bonding strength is increased as the bonding interfacial area $S_1$ between the conductive element 206 and the conductive connector 306' increases. Therefore, mechanisms for forming a PoP structure with an increased bonding interfacial area are desirable.

Figure 3A:
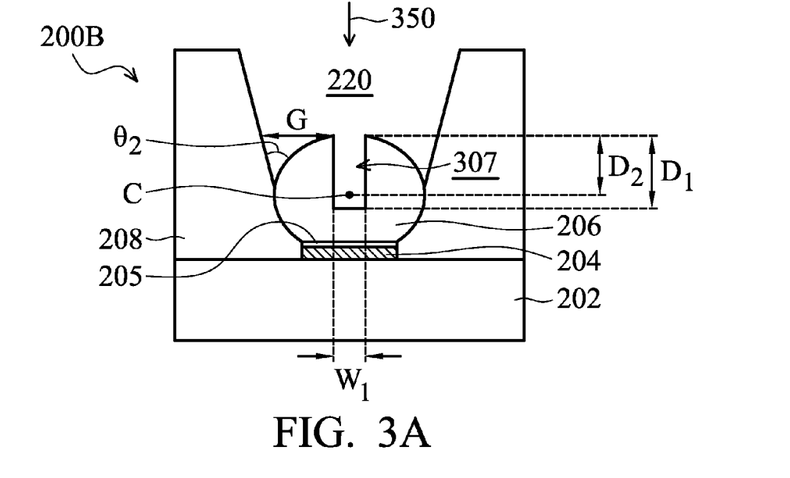
FIGS. 3A-3B show cross-sectional representations of various stages of forming a package on package (PoP) structure, in accordance with some embodiments of the disclosure.
Figure 3B:
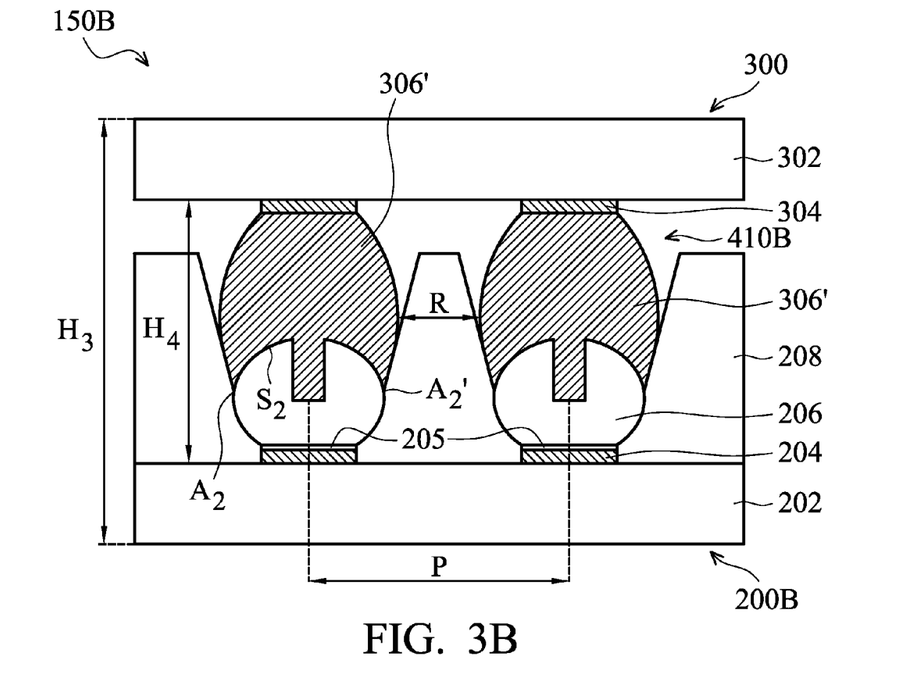

FIGS. 3A-3B show cross-sectional representations of various stages of forming a PoP structure 150B, in accordance with some embodiments of the disclosure. FIG. 3A shows a cross-sectional representation of a semiconductor device package 200B.

As shown in FIG. 3A, a recess 307 is formed in the conductive element 206. The recess 307 is formed to provide an additional bonding interfacial area for bonding with a conductive connector in subsequent processes, which will be described later.

In some embodiments, the recess 307 is formed by a laser drill process 350. In some embodiments, the removal speed of the laser drill process 350 can be controlled by laser drilling parameters such as wavelength or power. In some embodiments, the laser beam wavelength used in the laser drilling process 350 is about 532 nm or about 1064 nm. In some embodiments, the power of the laser drilling process 350 is in a range from about 2 W to about 6 W. In some other embodiments, the power of the laser drilling process 350 is in a range from about 2 W to about 10 W. The operation time of the laser drilling process 350 is chosen depending on the needed depth of the recess 307. In some embodiments, the removal of the molding compound 208 and formation the recess 307 are carried out by the same laser tool. For example, the recess 307 is formed after removing the molding compound 208 with using the same laser tool. Alternatively, in some other embodiments, the molding compound 208 and the recess 307 are removed by different laser tools with different wavelengths or powers.

As a result, the semiconductor device package 200B with the recess 307 in the conductive element 206 is obtained. As shown in FIG. 3A, the recess 307 has a cross-sectional view with an U-shape. In some embodiments, more than one recess 307 is formed, from a top-view, to provide additional bonding interfacial areas. Referring to FIG. 3A again, the recess 307 has a width $W_1$ and a depth $D_1$. In some embodiments, the width $W_1$ is in a range from about 10 μm to about 300 μm. In some embodiments, the depth $D_1$ is greater than a depth $D_2$ from the top of the conductive element 206 to the center C of the conductive element 206. Alternatively, the depth $D_1$ is smaller than or equal to the depth $D_2$ to meet design requirements. In some embodiments, the depth $D_1$ is in a range from about 5 μm to about 300 μm.

As shown in FIG. 3A, the distance between the molding compound 208 and the top portion of the conductive element 206 is marked as "G". In some embodiments, the distance G is in a range from about 10 to about 500 μm. In some embodiments, an angle $\theta_2$ between a sidewall of the opening 220 and a tangent line of a sidewall of the conductive element 206 in the opening 220 is in a range from about 5 degrees to about 60 degrees.

Afterwards, referring to FIG. 3B, the conductive element 206 of the semiconductor device package 200B and the conductive connector 306 of the semiconductor device package 300 are aligned and fused together by a reflow process to form a bonding structure 410B. The semiconductor device package 200B and the semiconductor device package 300 are bonded together via the bonding structure 410B to form the PoP structure 150B. In some embodiments, the bonding structure 410B includes the metal pad 204, the metal pad 304, the conductive element 206 and a conductive connector 306' fused from the conductive connectors 306 and 308. In some embodiments, the bonding structure 410B has a height $H_4$ in a range from about 50 μm to about 1000 μm.

As shown in FIG. 3B, the conductive connector 306 flows into and fills the recess 307 after the reflow process. Note that the gap "G" shown in FIG. 3A is also filled with the conductive connector 306 after the reflow process. In some embodiments, the reflow process is performed at a temperature in a range from about 200° C. to about 300° C.

The recess 307 formed in the conductive element 206 increases the filling space and provides for an additional bonding interfacial area, in comparison with the conductive element 206 without any recesses (shown in FIG. 2C). Thus, more conductive connector 306' is contained, and the boding interfacial area $S_2$ (from $A_2$ to $A_2'$ shown in FIG. 3B) between the conductive connector 306' and the conductive element 206 is increased. In some embodiments, a ratio of the boding interfacial area $S_2$ of the bonding structure 410B to the bonding interfacial area $S_1$ of the bonding structure 410A as shown in FIG. 2E is about 1 to about 5. Therefore, the bonding strength between the conductive connector 306' and the conductive element 206 is improved.

As shown in FIG. 3B, the pitch P of the neighboring bonding structures 410B is in a range from 50 μm to about 1000 μm. The distance $H_3$, between the bottom surface of the semiconductor device package 200B and the upper surface of the semiconductor device package 300, is in a range from about 500 to about 1500 μm. The closest spacing R between the neighboring bonding structures 410B is in a range from about 20 to about 500 μm. The embodiments shown in FIG. 3B are merely examples, and three or more conductive elements 206 may also be implemented.

Figure 3C:
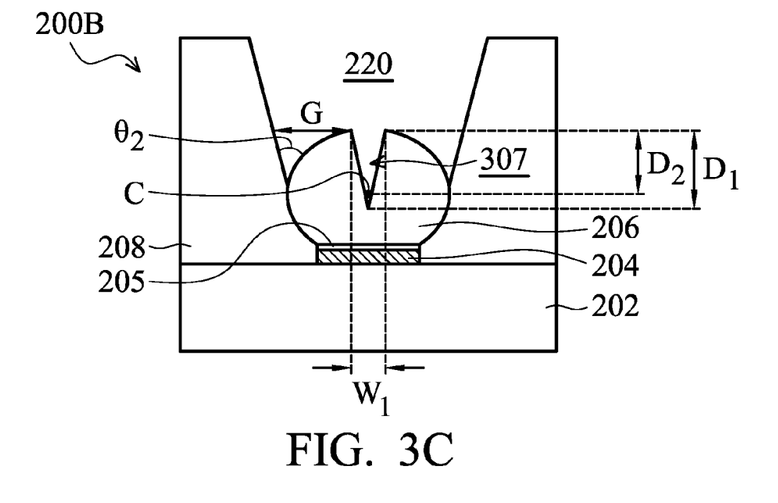
FIG. 3C shows a cross-sectional representation of a conductive element in accordance with some embodiments of the disclosure.
Figure 3D:
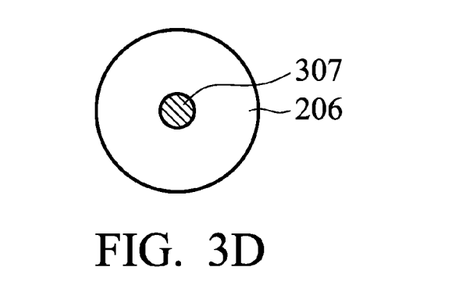
FIGS. 3D and 3E show top views of conductive element in accordance with some embodiments of the disclosure.
Figure 3E:
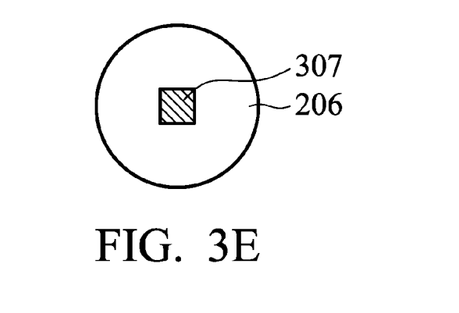

In some embodiments, the recess 307 may have a cross-sectional view with other shapes, such as a V-shape as shown in FIG. 3C or the U-shape as shown in FIG. 3A but with rounded bottom corners. In addition, in some embodiments, the recess portion 307 has a top view with a shape of circle or square, as shown in FIGS. 3D and 3E, respectively. Alternatively, the recess portion 307 may have a top view with a shape of oval, triangle, rectangle, rhombus, trapezoid shape, or any other suitable polygon.

Figure 4A:
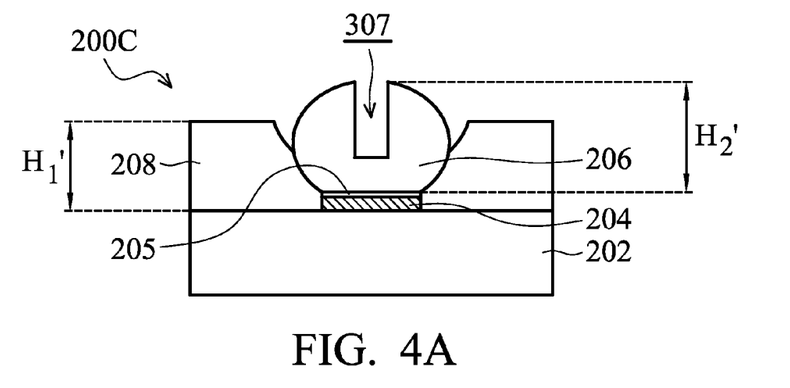
FIGS. 4A-4B show cross-sectional representations of various stages of forming a package on package (PoP) structure, in accordance with some embodiments of the disclosure
Figure 4B:
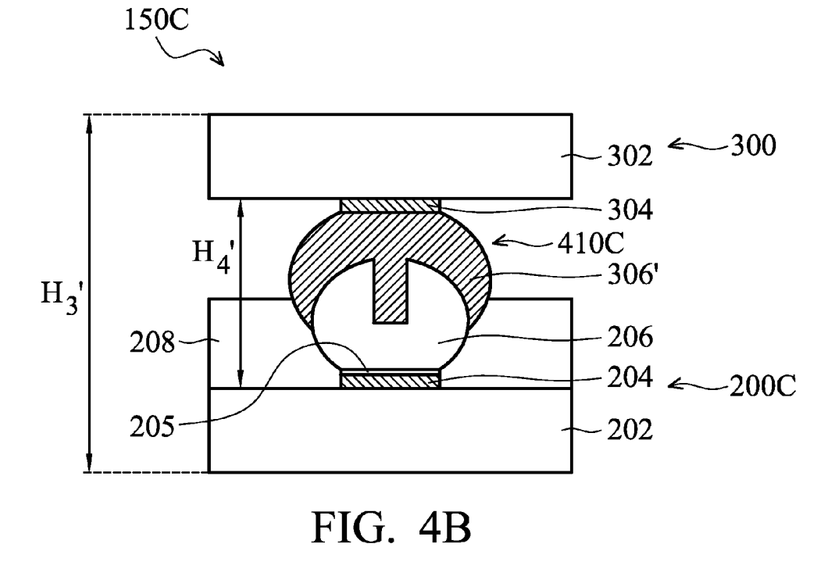

FIGS. 4A-4B show cross-sectional representations of various stages of forming a PoP structure 150C, in accordance with some embodiments of the disclosure. Referring to FIG. 4A, the molding compound 208 has a height $H_1'$ which is lower than the height $H_1$ of the molding compound 208 as shown in FIG. 2C. In some embodiments, the height $H_1'$ of the molding compound 208 is in a range from about 10 to about 500 μm. In some embodiments, the height $H_2'$ of the conductive element 206 is higher than the height $H_1'$ of the molding compound 208. In some other embodiments, the height $H_2'$ of the conductive element 206 is lower than the height $H_1'$ of the molding compound 208.

Referring to FIG. 4B, the semiconductor device package 200C and another semiconductor device package 300 are bonded via a bonding structure 410C, and the PoP structure 150C is obtained. In some embodiments, the bonding structure 410C includes the metal pad 204, the metal pad 304, the conductive element 206 and the conductive connector 306'.

Because the height $H_1'$ is lower than height $H_1$ (as shown in FIG. 2C), the distance $H_4'$ of the height of the bonding structure 410C is lower than the distance $H_4$, and the distance $H_3'$ between the bottom surface of the semiconductor device package 200C and the upper surface of the semiconductor device package 300 is lower than the distance $H_3$. In some embodiments, the distance $H_3'$ is in a range from about 450 to about 1450 μm. In some embodiments, the distance $H_4'$ is in a range from about 45 to about 900 μm. Although the height of the molding compound 208 is reduced, the reduced height $H_1'$ is still high enough to prevent the shorting from occurring between the neighboring bonding structures 410C.

The advantage of the PoP structure 150C in FIG. 4B is that the overall package height is reduced to meet advanced packaging requirements. Therefore, the PoP structure 150C achieves small form factor.

Figure 5A:
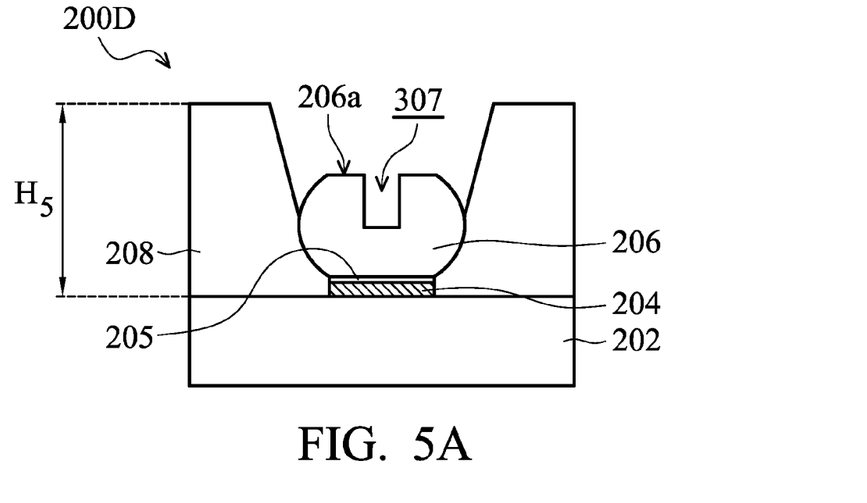
FIGS. 5A-5B show cross-sectional representations of various stages of forming a package on package (PoP) structure, in accordance with some embodiments of the disclosure.
Figure 5B:
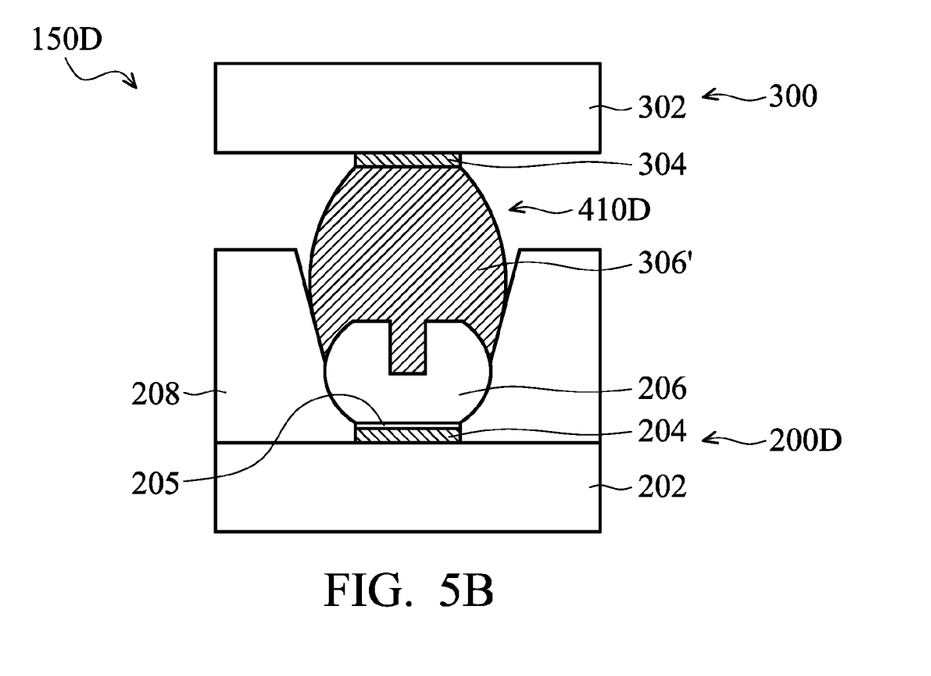

FIGS. 5A-5B show cross-sectional representations of various stages of forming a PoP structure 150D, in accordance with some embodiments of the disclosure.

Referring to FIG. 5A, the conductive element 206 has a substantially planar top surface 106a next to the recess 307. In some embodiments, before forming the molding compound 208, the top surface of the conductive element 206 is pressed and planarized by using a mold to form the substantially planar top surface 206a of the conductive element 206. Compared with the conductive element 206 having a curved top surface next to the recess 307 in FIG. 3A, the substantially planar top surface 206a of the conductive element 206 provides for a reduced height of the conductive element 206. Therefore, the height $H_5$ of the molding compound 208 is able to be further reduced. In some embodiments, the molding compound 208 has a height $H_5$ smaller than the height $H_1$ of the molding compound 208 as shown in FIG. 2C and greater than the height of the conductive element 206. Alternatively, the height $H_5$ is further reduced to smaller than the height of the conductive element 206. In some embodiments, the height $H_5$ is in a range from about 45 to about 900 μm.

Referring to FIG. 5B, the advantage of the PoP structure 150D in FIG. 5B is that the overall package height is reduced to meet advanced packaging requirements and the shorting problem between the neighboring bonding structures 410C is also almost completely prevented.

Figure 6A:
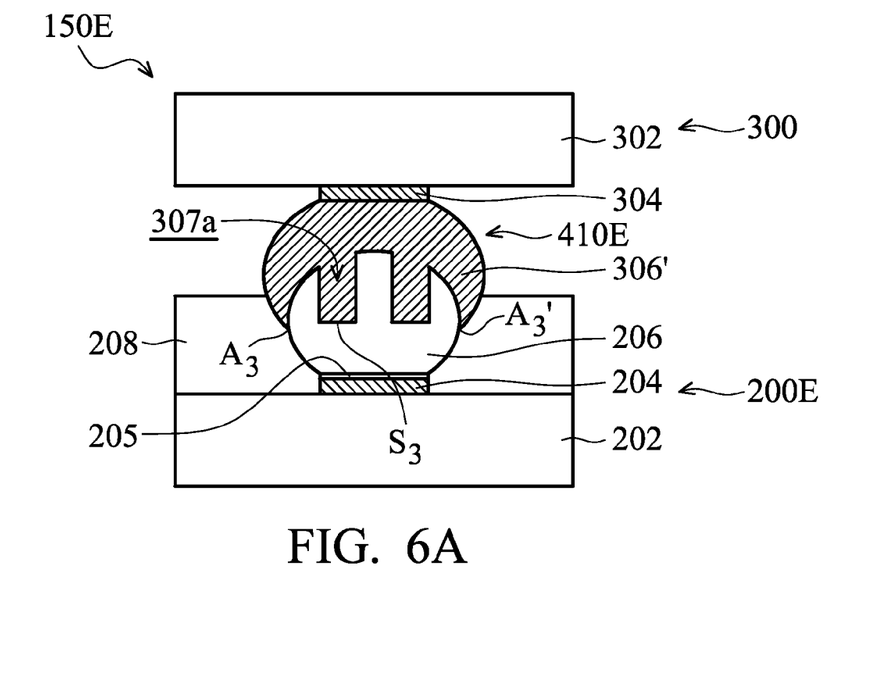
FIG. 6A shows a cross-sectional representation of a package on package (PoP) structure, in accordance with some embodiments of the disclosure.

FIG. 6A shows cross-sectional representations of various stages of forming a PoP structure 150E, in accordance with some embodiments of the disclosure.

Figure 6B:
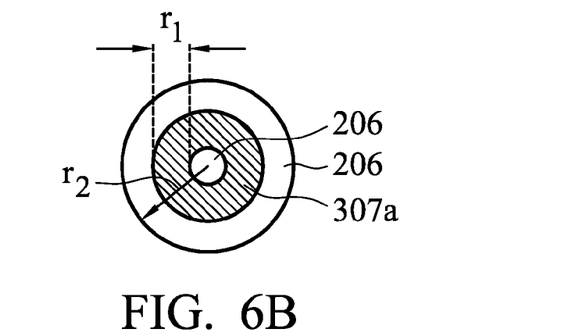
FIG. 6B shows a top view of a conductive element, in accordance with some embodiments of the disclosure.

Referring to FIG. 6A, in some embodiments, the conductive element 206 includes at least one protruding portion in the recess 307a. As such, the conductive element 206, from a top-view as shown in FIG. 6B, has a ring shape, and the height of the conductive element 206 is higher than that of the molding compound 208. In some embodiments, from a top view, a ratio of a width $r_1$ of the recess 307a to a radius of the conductive element $r_2$ is in a range from about 0.1 to about 0.8.

Because the ring shape of the recess 307a provides an additional bonding interfacial area $S_3$ (form $A_3$ to $A_3'$ shown in FIG. 6A) than the single recess (as shown in FIG. 3A), the bonding strength between the conductive element 206 and the conductive connector 306 is further improved.

Figure 7:
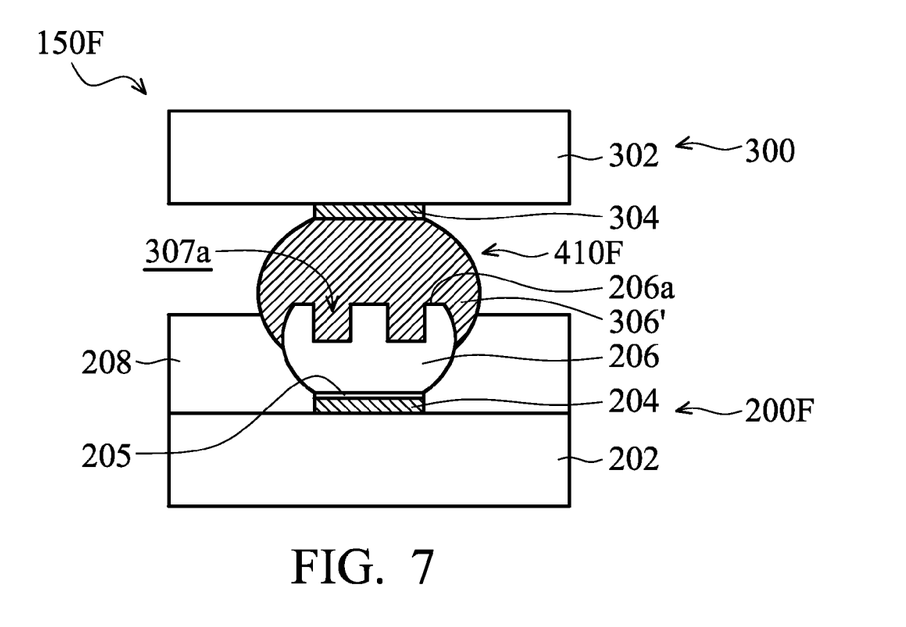
FIG. 7 shows a cross-sectional representation of a package on package (PoP) structure, in accordance with some embodiments of the disclosure.

FIG. 7 shows a cross-sectional representation of a PoP structure 150F, in accordance with some embodiments of the disclosure. Referring to FIG. 7, the recess 307a has a top view with a shape of a ring, and the conductive element 206 has a substantially planar top surface 206a next to the recess 307. Because the ring shape of the recess 307a and the substantially planar top surface 106a of the conductive element 206 provide an additional bonding interfacial area and a reduced height of conductive element 206, the bonding strength between the conductive element 206 and the conductive connector 306' is further improved, and the height of the molding compound 208 is further reduced.

Embodiments of mechanisms of forming a PoP structure are provided. A conductive element having a recess on one semiconductor device package is bonded to a conductive connector on another semiconductor device package to form a bonding structure. The formation of the recess on the semiconductor device package increases the bonding interfacial area. As a result, the bonding strength between two semiconductor device packages is improved due to the recess.

In some embodiments, a semiconductor device package is provided. The semiconductor device package includes a substrate and a metal pad formed on the substrate. The semiconductor device package further includes a conductive element formed on the metal pad, and the metal pad electrically contacts the conductive element, and at least a portion of the conductive element is embedded in a molding compound, and the conductive element has a recess configured to provide an additional bonding interfacial area.

In some embodiments, a package on package (PoP) structure is provided. The PoP structure includes a first semiconductor device package and a second semiconductor device package bonded via a boning structure. The bonding structure includes a conductive element embedded in a molding compound and a conductive connector bonded to the conductive element. The conductive element has a recess. The conductive connector fills the recess of the conductive element.

In some embodiments, a method for forming a package on package (PoP) structure is provided. The method includes forming a first semiconductor device package with a conductive element including at least a portion embedded in a molding compound. The conductive element has recess. The method includes forming a second semiconductor device package. The method also includes bonding the first semiconductor device package and a second semiconductor device package by forming a bonding structure, and the bonding structure includes the conductive element and a conductive connector filling the recess of the conductive element.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device package, comprising:
a substrate;
a metal pad formed on the substrate;
a conductive element formed on the metal pad, wherein the metal pad electrically contacts the conductive element, and at least a portion of the conductive element is embedded in a molding compound, and wherein the conductive element has a recess away from the metal pad configured to provide an additional bonding interfacial area, and the recess has a first depth greater than a second depth from a top surface of the conductive element to a center of the conductive element; and
a conductive connector bonded to the conductive element, wherein a melting point of the conductive element is higher than a melting point of the conductive connector, and the conductive connector is filled into the recess of the conductive element.

2. The semiconductor device package as claimed in claim 1, wherein the conductive element is made of copper (Cu), gold, silver or alloys thereof.

3. The semiconductor device package as claimed in claim 1, wherein the recess has a top view with a shape of circle, oval, square, triangle, rectangle, rhombus, trapezoid or a ring.

4. The semiconductor device package as claimed in claim 1, wherein the recess has a cross-sectional view with a U-shape or a V-shape.

5. The semiconductor device package as claimed in claim 1, wherein the molding compound has an opening exposing the conductive element, and an angle between a sidewall of the opening and the tangent line of a sidewall of the conductive element in the opening is in a range from about 5 degrees to about 60 degrees.

6. The semiconductor device package as claimed in claim 1, wherein a top surface of the molding compound is lower than a top surface of the conductive element, and the top surface of the molding compound is away from the metal pad.

7. The semiconductor device package as claimed in claim 1, wherein the conductive element has a curved surface next to the recess.

8. A package on package (PoP) structure, comprising
a first semiconductor device package and a second semiconductor device package bonded via a boning structure, wherein the bonding structure includes:
a metal pad embedded in the first semiconductor device package;
a conductive element formed on the metal pad and embedded in a molding compound, wherein the conductive element has a recess away from the metal pad, wherein the recess has a first depth greater than a second depth from a top surface of the conductive element to a center of the conductive element; and
a conductive connector bonded to the conductive element, wherein a melting point of the conductive element is higher than a melting point of the conductive connector, and the conductive connector is filled into the recess of the conductive element.

9. The package on package (PoP) structure as claimed in claim 8, wherein the conductive element connects to the metal pad.

10. The package on package (PoP) structure as claimed in claim 8, wherein the bonding structure further comprises another metal pad, wherein the another metal pad is configured to be bonded to the conductive connector of the second semiconductor device package.

11. The package on package (PoP) structure as claimed in claim 8, wherein the molding compound is higher than or lower than the conductive element.

12. The package on package (PoP) structure as claimed in claim 8, wherein the recess is configured to provide an additional bonding interfacial area between the conductive element and the conductive connector.

13. A method for forming package on package (PoP) structure, comprising:
forming a first semiconductor device package with a conductive element including at least a portion embedded in a molding compound, wherein the conductive element is formed on a metal pad and has a recess away from the metal pad;
forming a second semiconductor device package with a conductive connector; and
after forming the first semiconductor device package with the conductive element including at least the portion embedded in the molding compound, bonding the first semiconductor device package and the second semiconductor device package by forming a bonding structure, wherein the bonding structure includes the conductive connector made of solder filling the recess of the conductive element, and a melting point of the conductive element is higher than a melting point of the conductive connector.

14. The method as claimed in claim 13, wherein forming a first semiconductor device package comprises:
removing a portion of the molding compound to expose the conductive element; and
removing a portion of the conductive element to form the recess.

15. The method as claimed in claim 13, wherein the recess is configured to provide an additional bonding interfacial area.

16. The semiconductor device package as claimed in claim 1, wherein a top of the molding compound is below a top of the conductive connector and above a bottom of the recess.

17. The package on package (PoP) structure as claimed in claim 8, wherein a top of the molding compound is below a top of the conductive connector and above a bottom of the recess.

* * * * *